(12) United States Patent
Mizuuchi

(10) Patent No.: US 6,194,238 B1
(45) Date of Patent: Feb. 27, 2001

(54) METHOD OF MANUFACTURING PHOTOSENSITIVE SEMICONDUCTOR DEVICE

(75) Inventor: Kenji Mizuuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/489,013

(22) Filed: Jan. 21, 2000

Related U.S. Application Data

(60) Continuation of application No. 09/296,380, filed on Apr. 23, 1999, now Pat. No. 6,037,187, which is a division of application No. 09/064,039, filed on Apr. 23, 1998, now Pat. No. 6,080,999.

(30) Foreign Application Priority Data

Apr. 25, 1997 (JP) .................................................. 9-107988

(51) Int. Cl.⁷ .................................................. H01L 21/00
(52) U.S. Cl. .................................. 438/25; 438/24; 438/26
(58) Field of Search .................................. 438/24, 25, 26

(56) References Cited

U.S. PATENT DOCUMENTS

| | | |
|---|---|---|
| 4,712,017 | 12/1987 | Kamasaki . |
| 4,745,294 | 5/1988 | Kohashi et al. . |
| 5,057,457 | 10/1991 | Miyahara et al. . |
| 5,148,243 | 9/1992 | Merrick et al. . |
| 5,304,819 | 4/1994 | Torazawa et al. . |
| 5,389,578 | 2/1995 | Hodson et al. . |
| 5,472,915 | 12/1995 | Schairer et al. . |
| 5,647,034 | 7/1997 | Matsuda et al. . |
| 5,665,983 | 9/1997 | Nagano . |
| 5,770,867 | 6/1998 | Sata et al. . |
| 6,037,187 | * 3/2000 | Mizuuchi .............................. 438/25 |

* cited by examiner

Primary Examiner—Kevin M. Picardat
(74) Attorney, Agent, or Firm—Jones Volentine, L.L.C.

(57) ABSTRACT

In order to prevent deterioration of adhesion between a molding resin and a lead frame and a light transmission characteristic due to the attachment of a translucent resin to an upper surface of the lead frame upon charging a photocoupler with the translucent resin, a concave portion is provided in an island of a lead frame to which the smallest semiconductor device is attached. The filling of the translucent resin between opposed semiconductor devices includes filling through the concave portion. The provision of the concave portion prevents the translucent resin from contacting the upper surface, resulting in a more stable configuration.

2 Claims, 4 Drawing Sheets

METHOD OF MANUFACTURING PHOTOSENSITIVE SEMICONDUCTOR DEVICE

CROSS REFERENCE TO RELATED APPLICATIONS

This is a continuation application of application Ser. No. 09/296,380, filed Apr. 23, 1999, now U.S. Pat. No. 6,037, 187, which is a divisional of application Ser. No. 09/064, 039, filed Apr. 23, 1998, now U.S. Pat. No. 6,080,999, both of which are hereby incorporated by reference in their entirety for all purposes.

BACKGROUND OF THE INVENTION

1. Field of the Invention

This invention relates to a photosensitive semiconductor device, and particularly to a photocoupler having a photo-emitting device and a photo-detecting device shaped in integral form.

2. Description of the Related Art

FIG. 4 is a view showing a section structure of a previously-used photocoupler. The prior art photocoupler will be explained below with reference to FIG. 4.

In FIG. 4, reference numerals 1 and 2 indicate a lead frame on the photo- or light-emission side and a lead frame on the photo- or light-reception side, respectively. A light- or photo-emitting device 3 and a light- or photo-receiving or -detecting device 4 are fixed to islands of the lead frames 1 and 2 respectively. Designated at numeral 5 shown in FIG. 4 is a light-transmissive or translucent resin, which couples the photo-emitting device 3 and the photo-detecting device 4 to each other in an opposed state. Further, they are resin-sealed with an epoxy molding resin to prevent external random light.

FIGS. 5(A) and 5(B) are respectively views showing configurations of conventional lead frame 1 on the light-emission side and lead frame 2 on the light-reception side. FIG. 6 is a view illustrating the manner of charging of the translucent resin 5. A method of manufacturing the photocoupler shown in FIG. 4 will be explained below with reference to FIGS. 5 and 6.

A photo-emitting device 3 and a photo-detecting device 4 are fixed to diagonally-shaded regions of islands of the lead frames shown in FIGS. 5(A) and 5(B).

Thereafter, the lead frame 1 with the photo-emitting device 3 placed thereon and the lead frame 2 with the photo-detecting device 4 placed thereon are placed as opposed to each other as shown in FIG. 6. In this condition, the translucent resin 5 is filled between the lead frame 1 and the lead frame 2 from diagonally above the lead frame 1 by the use of a dispenser 7 to thereby couple the photo-emitting device 3 and the photo-detecting device 4 to each other.

Thereafter, the whole part is plastic-sealed with a mold sealing material 6 to create the photocoupler shown in FIG. 4.

However, the conventional photocoupler has a problem in that upon fabrication of the photocoupler, the translucent resin 5 to be filled adheres to an upper surface (corresponding to a surface not opposed to the lead frame 2 on the light-emission side) of the lead frame 1 due to a subtle position displacement of the dispenser 7 for filling the translucent resin 5 (this state is indicated by a circle mark in FIG. 6).

As a result, the shape of the translucent resin 5 varies according to the position of the dispenser 7. This type of photocoupler has a problem in that since light reflected from an interface between the translucent resin 5 and the molding resin 6 is detected by the photo-detecting device 4, the efficiency of light transmission by the photocoupler varies as the translucent resin 5 changes in shape.

Further, a problem also arises in that the adhesion between the lead frame 1 and the molding resin 6 is deteriorated due to the attachment of the translucent resin 5 to the upper surface of the lead frame 1.

SUMMARY OF THE INVENTION

With the foregoing problems in view, it is therefore an object of the present invention to prevent deterioration of adhesion between a molding resin and a lead frame and a light transmission characteristic due to the adhesion of a translucent resin to an upper surface of the lead frame upon charging a photocoupler with the translucent resin.

According to one aspect of this invention, for achieving the above object, there is provided a photosensitive semiconductor device comprising a first lead frame having a first island to which a photo-emitting semiconductor device is fixed, a second lead frame having a second island to which photo-detecting semiconductor device is fixed, a translucent resin for coupling the photo-emitting semiconductor device and the photo-detecting semiconductor device to each other in an opposed state, a sealing material for surrounding the translucent resin, and a concave portion defined in either one of ends of the first and second islands.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

[First Embodiment]

Figure 1:
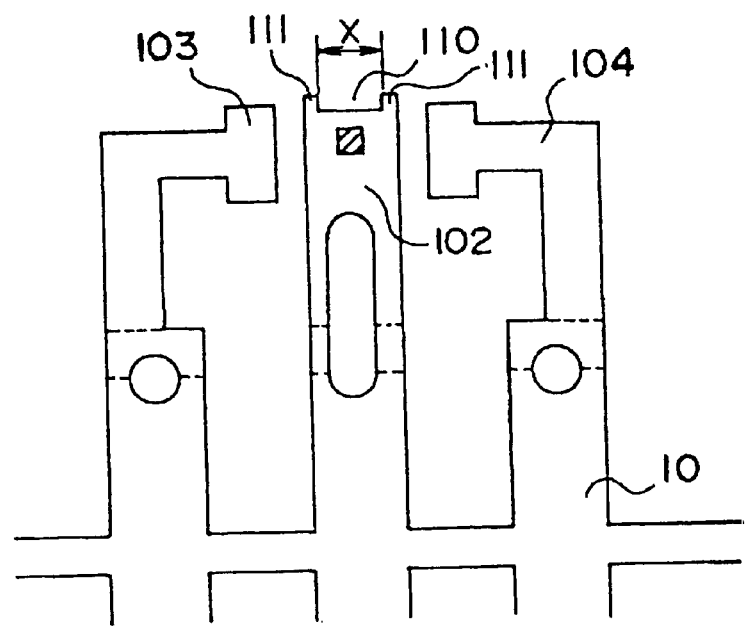
FIG. 1 is a view showing a lead frame on the light-emission side, which is employed in a first embodiment of the present invention.
Figure 2:
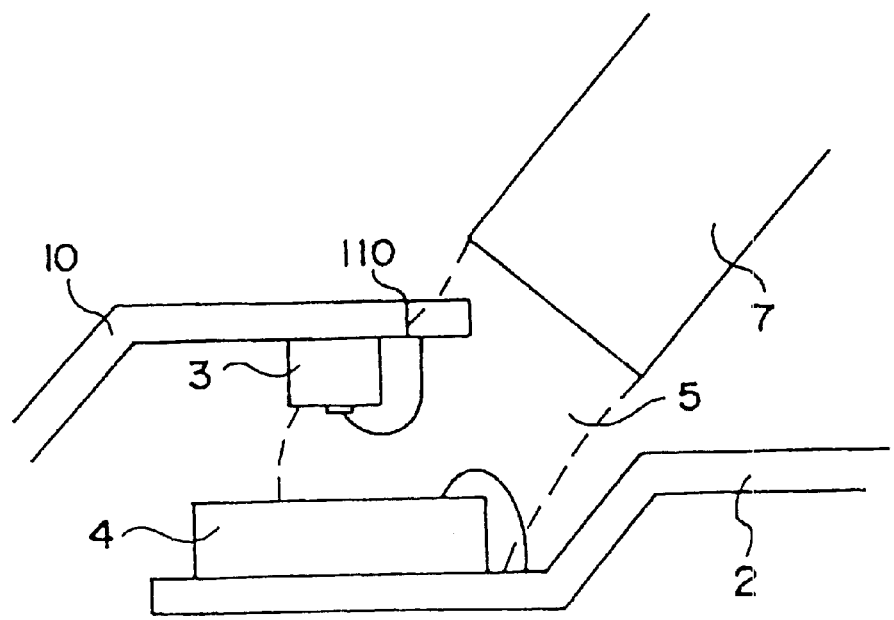
FIG. 2 is a view illustrating the manner in which a translucent resin is charged into a photocoupler according to the present invention.
Figure 4:
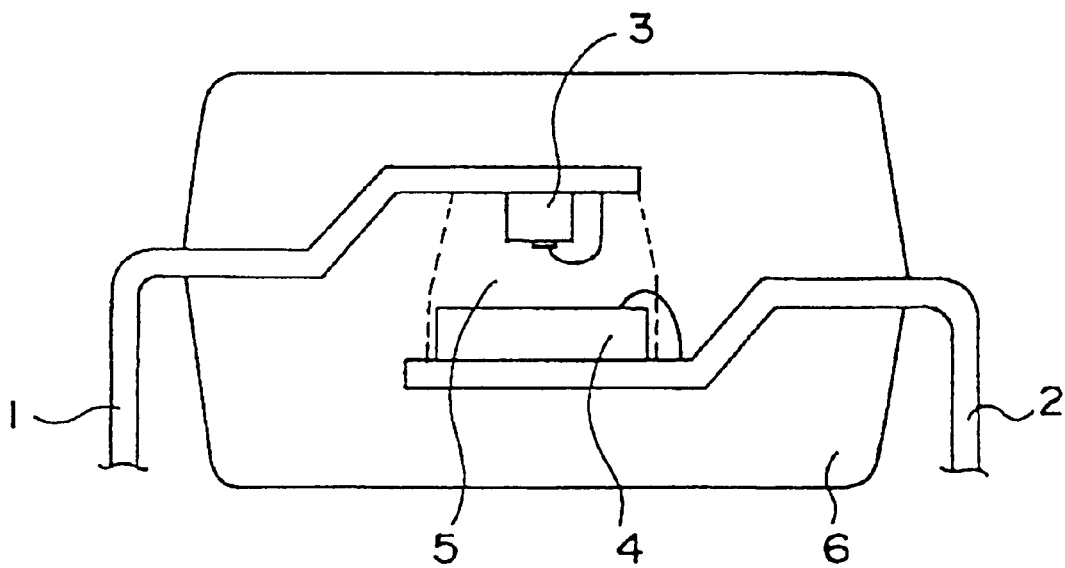
FIG. 4 is a view showing a section structure of a conventional photocoupler.
Figure 5:
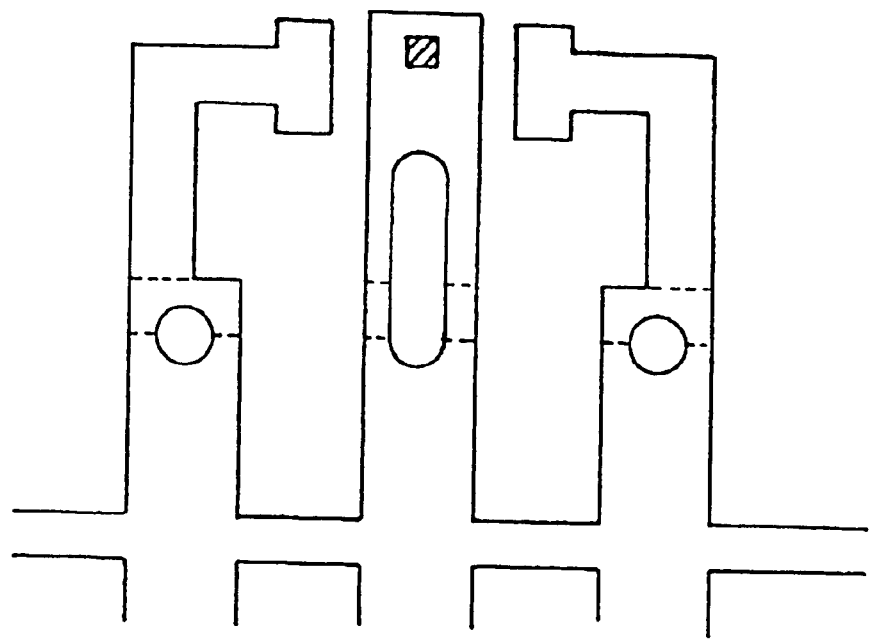
FIGS. 5(A) and 5(B) are views illustrating a lead frame of a conventional photocoupler.
Figure 5:
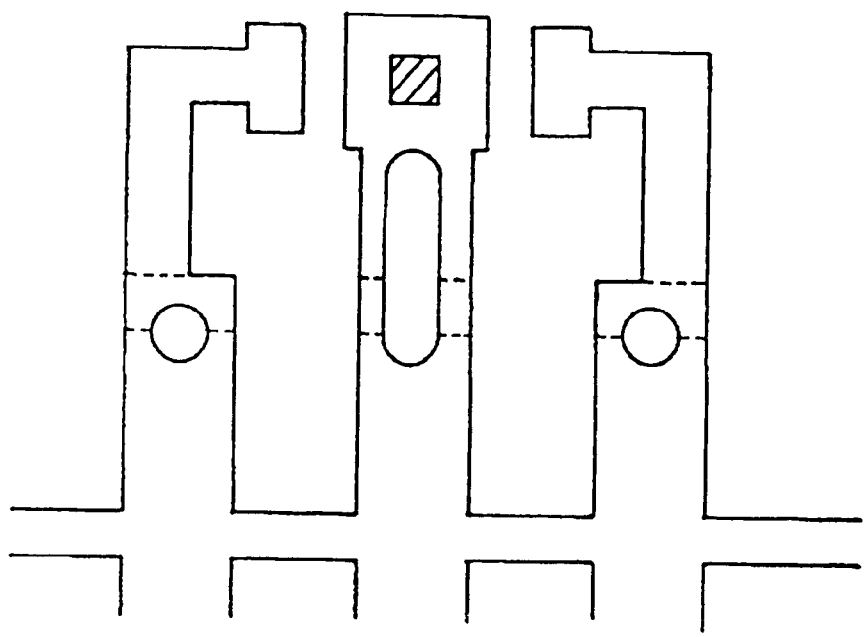
Figure 6:
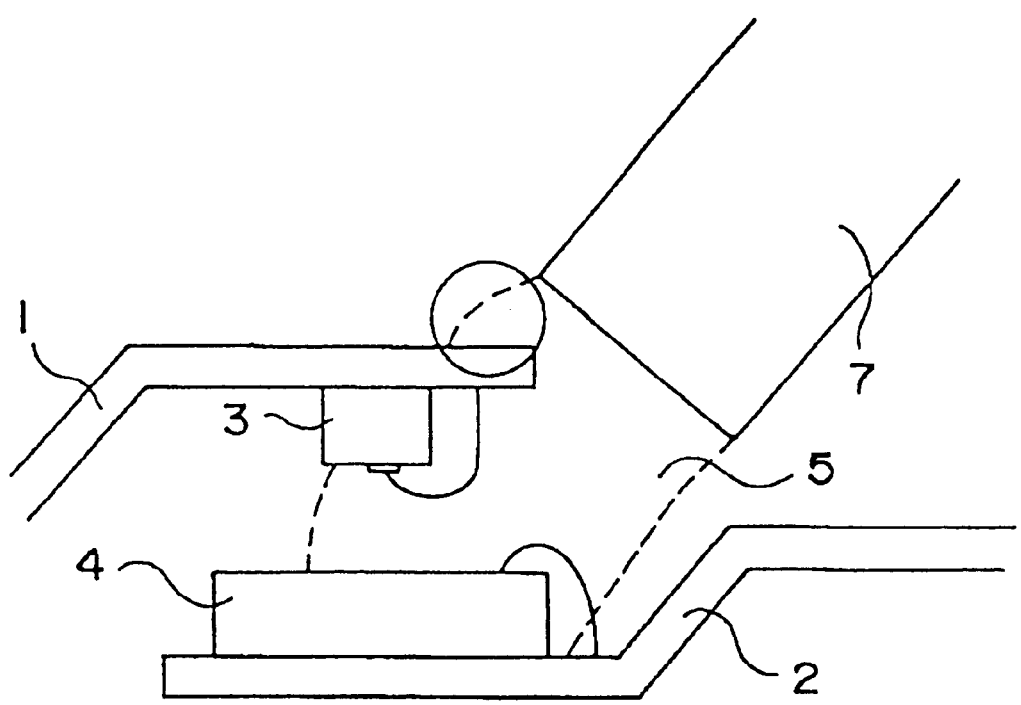
FIG. 6 is a view depicting the manner in which a translucent resin is charged into a conventional photocoupler.

FIG. 1 is a view showing a lead frame on the light-emission side, of a photocoupler according to a first embodiment of the present invention. FIG. 2 is, a view illustrating the manner in which a light-transmissive or translucent resin is charged into the photocoupler according to the present invention in a state in which a photo-emitting device and a photo-detecting device are opposed to each other. In these drawings, components common to those shown in FIGS. 4, 5 and 6 are identified by the same reference numerals. The present invention will be explained below with reference to FIGS. 1 and 2.

A lead frame 10 on the light-emission side has an island 102 with a photo-emitting device placed thereon, and leads 103 and 104 electrically connected to the outside. As shown in FIG. 1, the island 102 with the photo-emitting device mounted thereon has a concave portion 110 whose width X is about 0.3 mm, and sharp edges (convex portions) 111, which are respectively provided in the neighborhood of the center of an end thereof and at both ends thereof. It is desirable that the width X of the concave portion 110 is slightly greater than the diameter of a dispenser 7 for filling a translucent resin 5.

On the other hand, a lead frame on the light-reception side is similar to the conventional one shown in FIG. 5(B).

A method of manufacturing a photocoupler according to the present invention will be described below.

In the lead frame 10 on the light-emission side, a photo-emitting device 3 is fixed to a diagonally-shaded region in FIG. 1. A photo-detecting device is similar to that employed in the prior art.

Thereafter, the lead frame 10 with the photo-emitting device 3 fixed thereto and the lead frame 2 with the photo-detecting device 4 fixed thereto are placed as opposed to each other as shown in FIG. 2. In this condition, the translucent resin 5 is charged between the lead frame 10 and the lead frame 2 from diagonally above the lead frame 10 by the use of the dispenser 7 to thereby couple the photo-emitting device 3 and the photo-detecting device 4 to each other.

Thereafter, the whole part is resin-sealed with a mold sealing material 6 to process the lead frames into final shapes, thereby creating a photocoupler according to the present invention.

According to the present invention, even if the dispenser for filling the translucent resin 5 is subtly shifted in position due to the definition of the concave portion 110 in the island 102 of the lead frame 10 in the process for fabricating the photocoupler, the translucent resin 5 flows into the lower surface of the lead frame 10 through the concave portion 110. Therefore, no translucent resin 5 adheres to the upper surface of the lead frame 10. Thus, the adhesion of the lead frame 10 to the mold sealing material 6 is improved.

Since the edges (convex portions) 111 exist in the island 102 of the lead frame 10, the translucent resin 5 can be shaped to the leading portions or tips of the sharp edges (convex portions) 111 under the action of the surface tension of the translucent resin 5. Namely, the translucent resin 5 can be shaped into an offset-free stable form owing to the existence of the sharp edges (convex portions) in the island. Further, a light transmission characteristic can be also stabilized.

[Second Embodiment]

Figure 3:
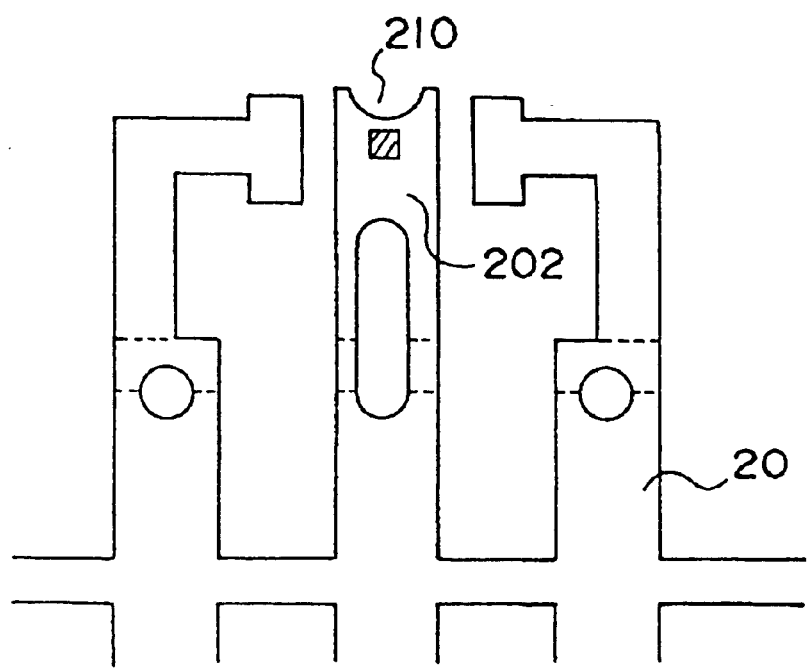
FIG. 3 is a view depicting a lead frame on the light-emission side, which is employed in a second embodiment of the present invention.

FIG. 3 is a view showing a lead frame 20 on the light-emission side, which is employed in a second embodiment of the present invention. In the second embodiment, a concave portion 210 defined in an island 202 of the lead frame 20 is shaped into an arcuate form. Other elements of structure are similar to those employed in the first embodiment.

According to the second embodiment, since the shape of the concave portion 210 is brought into the circular arc, an advantageous effect similar to that obtained in the first embodiment is obtained. In addition to this effect, the surface tension of the translucent resin 5 increases upon charging the translucent resin 5 between the frames because portions orthogonal to the concave portion 210 do not exist, whereby the translucent resin 5 having a stabler shape can be formed. In other words, the efficiency of light transmission can be obtained stabler.

The present invention is not necessarily limited to the concave portions having the shapes illustrated in the first and second embodiments. Other concave shapes may be used if those having effects similar to the above are taken.

Although the first and second embodiments have described the case in which the translucent resin is filled from the light-emission side, the translucent resin may be charged from the light-reception side.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a photosensitive semiconductor device, comprising:

preparing a first lead frame having a first island with a concave portion defined in an end thereof;

preparing a second lead frame having a second island;

fixing a smaller one of a photo-emitting semiconductor device and a photo-detecting semiconductor device to said first island;

fixing another one of said photo-emitting semiconductor device and said photo-detecting semiconductor device to said second island;

filling a translucent resin in a state in which said photo-emitting semiconductor device and said photo-detecting semiconductor device are opposed to each other, to thereby connect said photo-emitting semiconductor device and said photo-detecting semiconductor device to each other, said filling a translucent resin including filling through the concave portion; and forming a sealing material for surrounding said translucent resin.

2. A method according to claim 1, wherein said step for preparing the first lead frame is a step for preparing a first lead frame having a first island having a concave portion shaped into a circular arc form.

* * * * *